United States Patent
Gerlach

(10) Patent No.: US 8,050,419 B2
(45) Date of Patent: Nov. 1, 2011

(54) ADAPTIVE INITIAL VOLUME SETTINGS FOR A VEHICLE AUDIO SYSTEM

(75) Inventor: Jonathan L. Gerlach, Canton, MI (US)

(73) Assignee: General Motors LLC, Detroit, MI (US)

( * ) Notice: Subject to any disclaimer, the term of this patent is extended or adjusted under 35 U.S.C. 154(b) by 884 days.

(21) Appl. No.: 12/059,538

(22) Filed: Mar. 31, 2008

(65) Prior Publication Data

US 2009/0245533 A1    Oct. 1, 2009

(51) Int. Cl.
*H03G 3/20* (2006.01)
*H04B 1/00* (2006.01)

(52) U.S. Cl. ........................................................ 381/86

(58) Field of Classification Search .................... 381/86, 381/102, 104, 107, 109, 120, 56, 58; 455/419, 455/420, 20, 41.2, 41.3, 42, 569.1, 569.2, 455/575.6, 355, 200.1, 219; 704/231, 270, 704/246, 273, 243; 700/94
See application file for complete search history.

(56) References Cited

U.S. PATENT DOCUMENTS

| | | | |
|---|---|---|---|
| 5,671,267 A * | 9/1997 | August et al. | 455/420 |
| 5,673,268 A * | 9/1997 | Sharma et al. | 370/522 |
| 7,680,514 B2 * | 3/2010 | Cook et al. | 455/557 |
| 2002/0167488 A1* | 11/2002 | Hinckley et al. | 345/156 |
| 2004/0202337 A1* | 10/2004 | Jun | 381/107 |
| 2004/0204168 A1* | 10/2004 | Laurila | 455/569.1 |
| 2009/0022333 A1* | 1/2009 | Yamaguchi | 381/71.4 |
| 2009/0080673 A1* | 3/2009 | Laurent | 381/86 |
| 2009/0117945 A1* | 5/2009 | Mahler et al. | 455/569.1 |
| 2009/0170436 A1* | 7/2009 | Olofsson | 455/41.3 |

* cited by examiner

*Primary Examiner* — Dao H Nguyen
*Assistant Examiner* — Tram H Nguyen
(74) *Attorney, Agent, or Firm* — Anthony L. Simon; Reising Ethington P.C.

(57) ABSTRACT

A vehicle audio system such as a vehicle radio is integrated with a vehicle speech system so that outputted speech by the vehicle speech system is played through the audio system. When a speech session begins, the audio system mutes any entertainment audio being played and outputs audio speech received from the vehicle speech system at an initial volume that is constrained to be between minimum and maximum initial volume settings. These initial volume settings are automatically adjusted by the audio system if it detects that the user has a tendency to repeatedly adjust the volume past one of these settings each time a speech session is carried out.

15 Claims, 2 Drawing Sheets

ADAPTIVE INITIAL VOLUME SETTINGS FOR A VEHICLE AUDIO SYSTEM

TECHNICAL FIELD

The present invention relates generally to vehicles having integrated telematics and infotainment systems and, more particularly, to techniques for controlling audio output volume when switching between audio infotainment and telematics audio output.

BACKGROUND OF THE INVENTION

Vehicles today commonly come equipped with speech interfaces for the driver or other user. These speech interfaces can be used by automatic speech recognition (ASR) systems and/or by an onboard telematics unit to permit the user to carry on voice telephone calls. In some vehicles, both the ASR and telephony capabilities are integrated together into a single telematics unit having the speech interface. Telematics units that utilize these speech interfaces are commonly now offered as original equipment on many vehicles and in many cases come as standard equipment. OEM installation of such systems permits the manufacturer to integrate the telematics unit and its speech interface in with other vehicle systems. For example, the audio entertainment systems installed on these vehicles by the manufacturer can include traditional stereo components, satellite radio, as well as integration in with an on-board video entertainment. Operation of the telematics unit can be coordinated with the vehicle audio system so that, for example, the speech from the telematics unit's speech interface is played through one or more of the audio system speakers at a volume controllable by the radio volume knob. Then, when a call comes in to the telematics unit or when the user initiates a speech recognition session with the telematics unit, the radio can be automatically muted while the call or session is in effect and the volume of the caller or ASR system speech can be adjusted by the user via the radio's volume knob. As used herein, these telephone calls and speech recognition sessions are referred to generically as speech sessions.

In one known system that integrates the telematics unit audio output with the vehicle's audio system, each time a speech session is begun, the audio system volume is set back to its previous setting that existed at the end of the most recent speech session. Thus, if the user had finished his or her previous session with the volume set at one-third of maximum volume, then at the initiation of the next speech session, then regardless of the current audio system volume set by the user for music or other infotainment, the volume is automatically adjusted to that one-third setting. The exception to this approach is that the audio system is configured with a minimum volume setting, so that if the user had ended the last speech session with the volume turned all the way down, the new session will begin with the volume at some predetermined minimum volume above zero. In this way, the user will be certain to hear the ASR system or caller.

SUMMARY OF THE INVENTION

According to one aspect of the invention, there is provided a vehicle audio system that includes an input for receiving audio speech signals, a user-adjustable volume selector such as a volume control knob, and a speaker. The audio system plays the audio speech signals via the speaker at a volume that is adjustable via the volume selector between a minimum volume setting and a maximum volume setting. The audio system is configured such that, at the beginning of a speech session, the audio system plays the audio speech signals at an initial speech session volume that is within a range bounded by at least one initial volume setting that is between the minimum and maximum volume settings. The audio system adjusts the initial volume setting following one or more speech sessions in which the volume is manually adjusted via the volume selector to a user-selected volume that is past the initial volume setting and out of the range. The audio system can be, for example, a vehicle speech system such as a telematics unit or ASR system, or can be, for example, a vehicle radio system that is also used to provide entertainment audio within the vehicle.

In one particular embodiment, both a minimum and maximum initial volume setting is used, with the initial speech session volume being set to be equal to the volume setting used during the most recent previous speech session if that previous speech session volume is within the range defined by these minimum and maximum initial settings; otherwise it is set at the nearest end of the range. This allows the speech session volume previously used by the driver or occupant to be maintained from one session to the next, yet helps avoid starting out the speech session at an inaudible volume or at too great a volume. If the system detects that the user repeatedly adjusts the volume beyond the minimum or maximum initial volume setting, the system adapts by adjusting the traversed initial volume setting towards the setting that has repeatedly been selected.

BRIEF DESCRIPTION OF THE DRAWINGS

One or more preferred exemplary embodiments of the invention will hereinafter be described in conjunction with the appended drawings, wherein like designations denote like elements, and wherein.

DETAILED DESCRIPTION OF THE PREFERRED EMBODIMENT(S)

Figure 1:
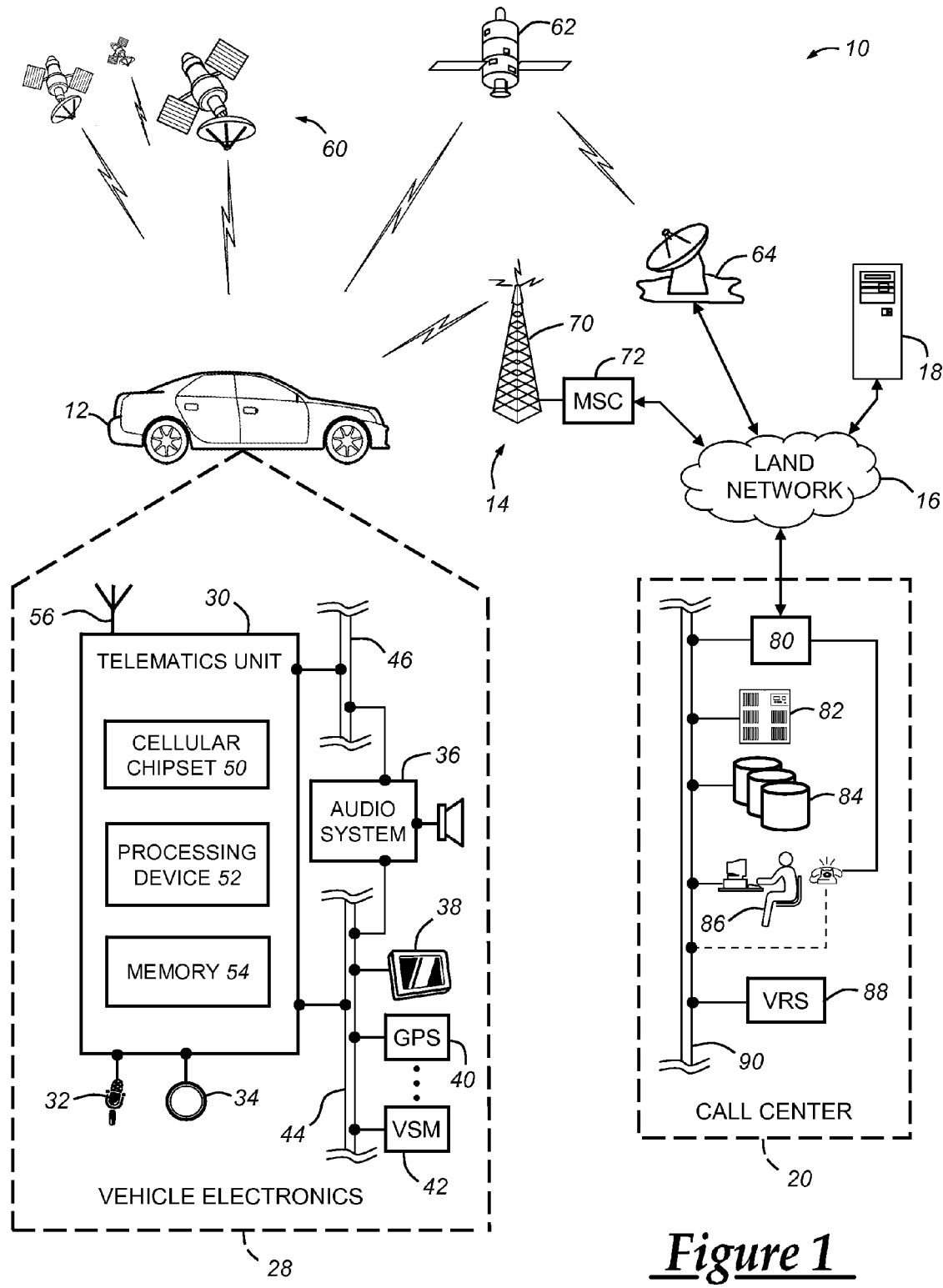
FIG. 1 is a block diagram depicting an exemplary embodiment of a communications system that is capable of utilizing the method disclosed herein.

With reference to FIG. 1, there is shown an exemplary operating environment that comprises a mobile vehicle communications system 10 and that can be used to implement the method disclosed herein. Communications system 10 generally includes a vehicle 12, one or more wireless carrier systems 14, a land communications network 16, a computer 18, and a call center 20. It should be understood that the disclosed method can be used with any number of different systems and is not specifically limited to the operating environment shown here. Also, the architecture, construction, setup, and operation of the system 10 and its individual components are generally known in the art. Thus, the following paragraphs simply provide a brief overview of one such exemplary system 10; however, other systems not shown here could employ the disclosed method as well.

Vehicle 12 is depicted in the illustrated embodiment as a passenger car, but it should be appreciated that any other vehicle including motorcycles, trucks, sports utility vehicles (SUVs), recreational vehicles (RVs), marine vessels, aircraft, etc., can also be used. Some of the vehicle electronics 28 is shown generally in FIG. 1 and includes a telematics unit 30, a microphone 32, one or more pushbuttons or other control inputs 34, an audio system 36, a visual display 38, and a GPS module 40 as well as a number of vehicle system modules (VSMs) 42. Some of these devices can be connected directly to the telematics unit such as, for example, the microphone 32 and pushbutton(s) 34, whereas others are indirectly connected using one or more network connections, such as a communications bus 44 or an entertainment bus 46. Examples of suitable network connections include a controller area network (CAN), a media oriented system transfer (MOST), a local interconnection network (LIN), a local area network (LAN), and other appropriate connections such as Ethernet or others that conform with known ISO, SAE and IEEE standards and specifications, to name but a few.

Telematics unit 30 is an OEM-installed device that enables wireless voice and/or data communication over wireless carrier system 14 and via wireless networking so that the vehicle can communicate with call center 20, other telematics-enabled vehicles, or some other entity or device. The telematics unit preferably uses radio transmissions to establish a communications channel (a voice channel and/or a data channel) with wireless carrier system 14 so that voice and/or data transmissions can be sent and received over the channel. By providing both voice and data communication, telematics unit 30 enables the vehicle to offer a number of different services including those related to navigation, telephony, emergency assistance, diagnostics, infotainment, etc. Data can be sent either via a data connection, such as via packet data transmission over a data channel, or via a voice channel using techniques known in the art. For combined services that involve both voice communication (e.g., with a live advisor or voice response unit at the call center 20) and data communication (e.g., to provide GPS location data or vehicle diagnostic data to the call center 20), the system can utilize a single call over a voice channel and switch as needed between voice and data transmission over the voice channel, and this can be done using techniques known to those skilled in the art.

According to one embodiment, telematics unit 30 utilizes cellular communication according to either GSM or CDMA standards and thus includes a standard cellular chipset 50 for voice communications like hands-free calling, a wireless modem for data transmission, an electronic processing device 52, one or more digital memory devices 54, and a dual antenna 56. It should be appreciated that the modem can either be implemented through software that is stored in the telematics unit and is executed by processor 52, or it can be a separate hardware component located internal or external to telematics unit 30. The modem can operate using any number of different standards or protocols such as EVDO, CDMA, GPRS, and EDGE. Wireless networking between the vehicle and other networked devices can also be carried out using telematics unit 30. For this purpose, telematics unit 30 can be configured to communicate wirelessly according to one or more wireless protocols, such as any of the IEEE 802.11 protocols, WiMAX, or Bluetooth. When used for packet-switched data communication such as TCP/IP, the telematics unit can be configured with a static IP address or can set up to automatically receive an assigned IP address from another device on the network such as a router or from a network address server.

Processor 52 can be any type of device capable of processing electronic instructions including microprocessors, microcontrollers, host processors, controllers, vehicle communication processors, and application specific integrated circuits (ASICs). It can be a dedicated processor used only for telematics unit 30 or can be shared with other vehicle systems. Processor 52 executes various types of digitally-stored instructions, such as software or firmware programs stored in memory 54, which enable the telematics unit to provide a wide variety of services. For instance, processor 52 can execute programs or process data to carry out at least a part of the method discussed herein.

Telematics unit 30 can be used to provide a diverse range of vehicle services that involve wireless communication to and/or from the vehicle. Such services include: turn-by-turn directions and other navigation-related services that are provided in conjunction with the GPS-based vehicle navigation module 40; airbag deployment notification and other emergency or roadside assistance-related services that are provided in connection with one or more collision sensor interface modules such as a body control module (not shown); diagnostic reporting using one or more diagnostic modules; and infotainment-related services where music, webpages, movies, television programs, videogames and/or other information is downloaded by an infotainment module (not shown) and is stored for current or later playback. The above-listed services are by no means an exhaustive list of all of the capabilities of telematics unit 30, but are simply an enumeration of some of the services that the telematics unit is capable of offering. Furthermore, it should be understood that at least some of the aforementioned modules could be implemented in the form of software instructions saved internal or external to telematics unit 30, they could be hardware components located internal or external to telematics unit 30, or they could be integrated and/or shared with each other or with other systems located throughout the vehicle, to cite but a few possibilities. In the event that the modules are implemented as VSMs 42 located external to telematics unit 30, they could utilize vehicle bus 44 to exchange data and commands with the telematics unit.

GPS module 40 receives radio signals from a constellation 60 of GPS satellites. From these signals, the module 40 can determine vehicle position that is used for providing navigation and other position-related services to the vehicle driver. Navigation information can be presented on the display 38 (or other display within the vehicle) or can be presented verbally such as is done when supplying turn-by-turn navigation. The navigation services can be provided using a dedicated in-vehicle navigation module (which can be part of GPS module 40), or some or all navigation services can be done via telematics unit 30, wherein the position information is sent to a remote location for purposes of providing the vehicle with navigation maps, map annotations (points of interest, restaurants, etc.), route calculations, and the like. The position information can be supplied to call center 20 or other remote computer system, such as computer 18, for other purposes, such as fleet management. Also, new or updated map data can be downloaded to the GPS module 40 from the call center 20 via the telematics unit 30.

Apart from the audio system 36 and GPS module 40, the vehicle 12 can include other vehicle system modules (VSMs) 42 in the form of electronic hardware components that are located throughout the vehicle and typically receive input from one or more sensors and use the sensed input to perform diagnostic, monitoring, control, reporting and/or other functions. Each of the VSMs 42 is preferably connected by communications bus 44 to the other VSMs, as well as to the telematics unit 30, and can be programmed to run vehicle system and subsystem diagnostic tests. As examples, one VSM 42 can be an engine control module (ECM) that controls various aspects of engine operation such as fuel ignition and ignition timing, another VSM 42 can be a powertrain control module that regulates operation of one or more components of the vehicle powertrain, and another VSM 42 can be a body control module that governs various electrical components located throughout the vehicle, like the vehicle's power door locks and headlights. According to one embodiment, the engine control module is equipped with on-board diagnostic (OBD) features that provide myriad real-time data, such as that received from various sensors including vehicle emissions sensors, and provide a standardized series of diagnostic trouble codes (DTCs) that allow a technician to rapidly identify and remedy malfunctions within the vehicle. As is appreciated by those skilled in the art, the above-mentioned VSMs are only examples of some of the modules that may be used in vehicle 12, as numerous others are also possible.

Vehicle electronics 28 also includes a number of vehicle user interfaces that provide vehicle occupants with a means of providing and/or receiving information, including microphone 32, pushbuttons(s) 34, audio system 36, and visual display 38. As used herein, the term 'vehicle user interface' broadly includes any suitable form of electronic device, including both hardware and software components, which is located on the vehicle and enables a vehicle user to communicate with or through a component of the vehicle. Microphone 32 is part of a vehicle speech system that provides audio input to the telematics unit to enable the driver or other occupant to provide voice commands and carry out hands-free calling via the wireless carrier system 14. For this purpose, it can be connected to an on-board automatic speech recognition (ASR) system utilizing human-machine interface (HMI) technology known in the art. This ASR system can be implemented as an integral portion of the telematics unit using processor 52 and memory 54. Alternatively, the ASR system can be provided independently of telematics unit 30 in which case the ASR system and telematics unit would constitute separate vehicle speech systems. The pushbutton(s) 34 allow manual user input into the telematics unit 30 to initiate wireless telephone calls and provide other data, response, or control input. Separate pushbuttons can be used for initiating emergency calls versus regular service assistance calls to the call center 20. Audio system 36 provides audio output to a vehicle occupant and can be a dedicated, stand-alone system or part of the primary vehicle audio system. According to the particular embodiment shown here, audio system 36 is operatively coupled to both vehicle bus 44 and entertainment bus 46 and can provide AM, FM and satellite radio, CD, DVD and other multimedia functionality. This functionality can be provided in conjunction with or independent of the infotainment module described above. Visual display 38 is preferably a graphics display, such as a touch screen on the instrument panel or a heads-up display reflected off of the windshield, and can be used to provide a multitude of input and output functions. Various other vehicle user interfaces can also be utilized, as the interfaces of FIG. 1 are only an example of one particular implementation.

Wireless carrier system 14 is preferably a cellular telephone system that includes a plurality of cell towers 70 (only one shown), one or more mobile switching centers (MSCs) 72, as well as any other networking components required to connect wireless carrier system 14 with land network 16. Each cell tower 70 includes sending and receiving antennas and a base station, with the base stations from different cell towers being connected to the MSC 72 either directly or via intermediary equipment such as a base station controller. Cellular system 14 can implement any suitable communications technology, including for example, analog technologies such as AMPS, or the newer digital technologies such as CDMA (e.g., CDMA2000) or GSM/GPRS. As will be appreciated by those skilled in the art, various cell tower/base station/MSC arrangements are possible and could be used with wireless system 14. For instance, the base station and cell tower could be co-located at the same site or they could be remotely located from one another, each base station could be responsible for a single cell tower or a single base station could service various cell towers, and various base stations could be coupled to a single MSC, to name but a few of the possible arrangements.

Apart from using wireless carrier system 14, a different wireless carrier system in the form of satellite communication can be used to provide uni-directional or bi-directional communication with the vehicle. This can be done using one or more communication satellites 62 and an uplink transmitting station 64. Uni-directional communication can be, for example, satellite radio services, wherein programming content (news, music, etc.) is received by transmitting station 64, packaged for upload, and then sent to the satellite 62, which broadcasts the programming to subscribers. Bi-directional communication can be, for example, satellite telephony services using satellite 62 to relay telephone communications between the vehicle 12 and station 64. If used, this satellite telephony can be utilized either in addition to or in lieu of wireless carrier system 14.

Land network 16 may be a conventional land-based telecommunications network that is connected to one or more landline telephones and connects wireless carrier system 14 to call center 20. For example, land network 16 may include a public switched telephone network (PSTN) such as that used to provide hardwired telephony, packet-switched data communications, and the Internet infrastructure. One or more segments of land network 16 could be implemented through the use of a standard wired network, a fiber or other optical network, a cable network, power lines, other wireless networks such as wireless local area networks (WLANs), or networks providing broadband wireless access (BWA), or any combination thereof. Furthermore, call center 20 need not be connected via land network 16, but could include wireless telephony equipment so that it can communicate directly with a wireless network, such as wireless carrier system 14.

Computer 18 can be one of a number of computers accessible via a private or public network such as the Internet. Each such computer 18 can be used for one or more purposes, such as a web server accessible by the vehicle via telematics unit 30 and wireless carrier 14. Other such accessible computers 18 can be, for example: a service center computer where diagnostic information and other vehicle data can be uploaded from the vehicle via the telematics unit 30; a client computer used by the vehicle owner or other subscriber for such purposes as accessing or receiving vehicle data or to setting up or configuring subscriber preferences or controlling vehicle functions; or a third party repository to or from which vehicle data or other information is provided, whether by communicating with the vehicle 12 or call center 20, or both. A computer 18 can also be used for providing Internet connectivity such as DNS services or as a network address server that uses DHCP or other suitable protocol to assign an IP address to the vehicle 12.

Call center 20 is designed to provide the vehicle electronics 28 with a number of different system back-end functions and, according to the exemplary embodiment shown here, generally includes one or more switches 80, servers 82, databases 84, live advisors 86, as well as an automated voice response system (VRS) 88, all of which are known in the art. These various call center components are preferably coupled to one another via a wired or wireless local area network 90. Switch 80, which can be a private branch exchange (PBX) switch, routes incoming signals so that voice transmissions are usually sent to either the live adviser 86 by regular phone or to the automated voice response system 88 using VoIP. The live advisor phone can also use VoIP as indicated by the broken line in FIG. 1. VoIP and other data communication through the switch 80 is implemented via a modem (not shown) connected between the switch 80 and network 90. Data transmissions are passed via the modem to server 82 and/or database 84. Database 84 can store account information such as subscriber authentication information, vehicle identifiers, profile records, behavioral patterns, and other pertinent subscriber information. Data transmissions may also be conducted by wireless systems, such as 802.11x, GPRS, and the like. Although the illustrated embodiment has been described as it would be used in conjunction with a manned call center 20 using live advisor 86, it will be appreciated that the call center can instead utilize VRS 88 as an automated advisor or, a combination of VRS 88 and the live advisor 86 can be used.

Audio System

Figure 2:
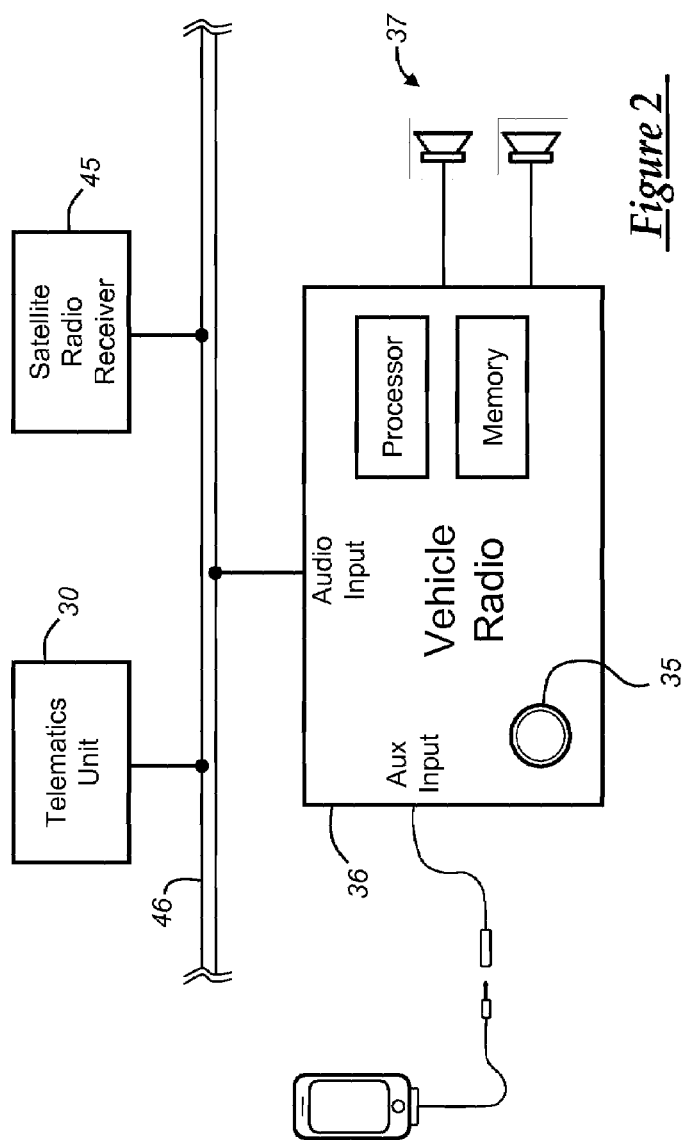
FIG. 2 is a block diagram of a portion of the vehicle hardware of FIG. 1 showing further details of the audio system.

With reference now to FIG. 2, further details of the audio system 36 and its operation and interaction with the telematics unit 30 will now be described in greater detail. The audio system 36 can be a vehicle radio having an internal tuner that receives broadcast programming content and outputs it to speakers 37. The vehicle radio is connected to the telematics unit 30 via the entertainment bus 46 and, for this purpose, has an audio input that receives audio speech signals representing, for example, speech received via wireless communication system 14 from a caller, or synthesized or pre-recorded speech outputted by the ASR system that is incorporated into telematics unit 30. The depicted audio input (or a separate audio input) can be used to receive other sources of infotainment audio, such as a satellite radio receiver 45. As used herein, the terms "entertainment audio" and "infotainment audio" are used interchangeably and both refer to content such as music, news, or other programming delivered in audio form from one or more devices such as the tuner on the radio itself or a separate device connected to one of the inputs. In other embodiments, the audio system is not a radio or other infotainment device, but instead comprises a vehicle speech system such as either a dedicated vehicle cellular telephony system (e.g., a telematics unit) or an ASR system, in which case the audio input could be connected to a microphone and the audio speech signals could be generated internally and then outputted to the speakers 37.

In the embodiment shown, the vehicle radio 36 includes a volume selector 35 which can be any of a wide variety of known user-activated input devices, such as a rotary knob or pair of momentary pushbuttons. Multiple volume selectors can be installed in the vehicle; for example, one on the front face of the radio and another on the vehicle's steering wheel hub. The vehicle radio can include a number of additional features, including one or more auxiliary inputs for connecting additional audio sources. In the illustrated embodiment, the vehicle radio includes a processor and memory, the use of which will be discussed below.

By interconnecting the telematics unit 30 and audio system 36 to the entertainment bus 46, audio output from the telematics unit can be played through the audio system on its speaker 37. The volume knob 35 can be used to separately control volume for both the entertainment audio from the audio system as well as the outputted audio speech signals from the telematics unit. Thus, as is conventional, when a call comes in to the telematics unit or when the user initiates a speech recognition session with the telematics unit, the radio can be automatically muted while the speech session is in effect and the volume of the caller or ASR system speech can be adjusted by the user via the radio's volume knob 35. This involves automatically interrupting the entertainment audio by inhibiting the playing of the entertainment audio over the speakers, and this is preferably done not only during receipt of the audio speech signals from the telematics unit 30, but even in between received groups of such speech signals. For this purpose, the telematics unit can provide the radio 36 with a control signal or message that tells it when a speech session begins and the radio can interrupt the entertainment audio and inhibit any further playing of entertainment audio until the telematics unit indicates that the speech session has concluded. This control signal or message can be provided to the radio via the entertainment bus 46, communication bus 44, or otherwise.

Often, the audio system output volume appropriate for conducting the speech session will be different than the current radio setting being used for entertainment audio. Thus, at the beginning of the speech session, the volume is automatically changed to an initial speech session volume that is determined by the radio 36 (e.g., using its processor). This initial speech session volume can be set equal to the volume used by the user during the most recent previous speech session. In particular, it can be set to be equal to the previous speech session volume that existed at termination of the most recent speech session, and the radio can be programmed to automatically save each speech session's volume setting in memory once the session ends so that it is available for use as the initial speech session volume during the next session. It will also be appreciated that the initial speech session volume can be determined in other ways. For example, it can be set to an average of a plurality of previous speech session volumes that were taken from a corresponding plurality of previous speech sessions. Or it could be set to a volume setting that is independent of the prior speech session volume settings selected by a user. Whatever the initial speech session volume is set to be, the user can subsequently change it to whatever volume is desired using the volume knob 35.

Figure 3:
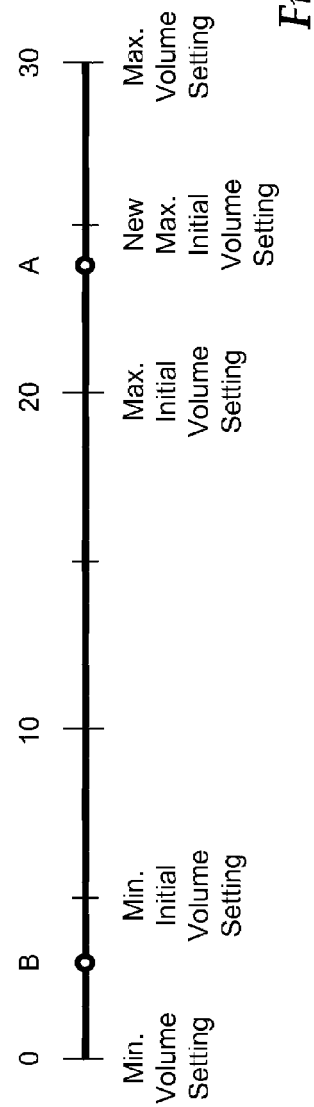
FIG. 3 is a diagram showing different initial volume settings used for outputting audio from the vehicle speech system of FIG. 1.

With reference now to FIG. 3, the output volume of the vehicle radio can be selected via the volume knob 35 to be anywhere from a minimum volume setting to a maximum setting. In the figure, an arbitrary total range of 0-30 is shown for the possible volume settings selectable by the volume knob. The minimum setting is typically a setting of volume=0 corresponding to the volume being turned off so that no sound is heard. The maximum setting (volume=30 in this example) is the highest volume to which the radio can be adjusted by the user. Within that total range are two initial volume settings, including a minimum initial volume setting (volume=5 in this example) and a maximum initial volume setting (volume=20 in this example). These initial volume settings define the outer boundaries of a range of volumes that the radio can use for the initial speech session volume. Thus, as noted above, when a speech session begins and any entertainment audio being played is muted, the initial speech session volume can be set back to the previous speech session volume used during the last speech session, but only if that previous volume is within the range defined by the minimum and maximum initial volume settings. By using the minimum initial volume setting as a floor to the possible initial speech setting volumes chosen by the radio, this helps insure that the speech session will begin at an audible level that the user is expected to be able to hear. Also, by using the maximum initial volume setting as a ceiling, this helps prevent accidental startling of the user due to excessive volume. Again, this bounded initial speech session volume is just a starting volume setting and can be adjusted immediately by the user to whatever audio level is desired.

To implement these minimum and maximum initial volume settings in determining the initial speech session volume setting, the radio can use an algorithm that sets the initial speech session volume to be equal to (1) the greater of the minimum initial volume setting and the previous speech session volume existing at termination of a previous speech session and (2) the lesser of the maximum initial volume setting and the previous speech session volume. In this way the initial speech session volume is set back to the previous speech session volume, unless that previous volume is outside the range defined by the minimum and maximum initial settings, in which case the exceeded initial volume setting is used.

The range defined by the initial volume settings can be selected to be sufficiently large enough to accommodate the range of speech session volumes utilized by most users. However, in some instances, a user may adjust the speech session volume outside of this range and may do so repeatedly (e.g., during most if not all speech sessions). For example, a person having some deafness or being hard of hearing might consistently turn up the volume from the initial speech session setting to a higher volume, such as indicated at point A on the diagram in FIG. 3. To avoid the need for the user to continue to have to adjust the volume upwardly at the beginning of each speech session, the radio adapts to this situation by automatically adjusting its maximum initial volume setting upwardly to either point A (e.g., volume=24) or something slightly above it (e.g., volume=25). The adjustment can be based on a single previous speech session volume setting in excess of the maximum initial volume setting or can be based on a plurality of such previous volume settings. Where a plurality of previous speech session volumes are used to determine an adjustment to the maximum initial volume setting, those previous volumes can be mathematically combined in any suitable manner, such as by simple averaging or by weighted averaging (e.g., by applying more significant weight to more recent user speech session volume settings). The result is a new maximum initial volume setting that is then used in determining the proper initial speech session volume at the beginning of the next speech session.

The foregoing discussion applies equally to the minimum initial volume setting to accommodate circumstances in which a user repeatedly turns down the volume from the initial speech session volume. Thus, for example, if the minimum initial volume level is distractingly high, the user may repeatedly lower the volume level below that minimum initial volume setting as indicated at point B on the diagram in FIG. 3, and the radio can respond by adaptively lowering the minimum initial volume setting to a setting at or near this point B. Furthermore, although both minimum and maximum initial volume settings are shown in FIG. 3, only one such endpoint is needed. For example, the maximum initial volume setting could be eliminated with the radio then being configured to set the initial speech session volume at the greater of the minimum initial volume setting or the previous volume setting used during the last speech session. Thus, in general, this approach involves playing the audio speech signals at an initial speech session volume that is within a range bounded by at least one initial volume setting that is between the minimum and maximum volume settings for the radio, and then adjusting the initial volume setting following one or more speech sessions in which the volume is manually adjusted via the volume selector to a user-selected volume that is past the initial volume setting and out of the range. This adjusted (new) initial volume setting can be stored at the radio in memory in place of the previous initial volume setting. And, as noted above, although only one such initial volume setting (e.g., a minimum initial volume setting) need be used, both a minimum and maximum initial setting can be used, as indicated in FIG. 3.

Either or both of the initial volume settings can be adjusted after each session or only intermittently, as desired for a particular implementation. Also, the initial volume settings can be initialized at a factory default setting (and can be returnable to those default settings under proper circumstances) and then adjusted from those defaults according to the approaches described above. Also, once an initial volume setting has been adjusted due to user selection(s) of a volume outside of the range between the minimum and maximum initial settings, they can be adjusted partially or completely back towards their earlier or default value if the radio detects that the user has begun using and maintaining a lower volume level. This allows the system to automatically adapt in the event that the primary vehicle driver changes, without necessitating a factory reset of the initial volume settings.

In another embodiment, the current volume radio setting (being used for listening to entertainment audio) that exists at the beginning of a speech session can be used in selecting a best estimate for a desired initial speech session volume. For example, the vehicle radio can monitor typical radio volume settings used in the vehicle and determine an average volume setting that is stored in the radio. Then, when a speech session begins, the radio can compare the current radio volume with the stored radio volume setting and use the difference to offset the initial speech session volume from the previous speech session volume that it would otherwise use. Thus, for example, if the radio is turned up because of a noisy environment compared to usual, then when radio use is interrupted to begin a speech session, the initial speech session volume will also be set higher than it normally would have been. In this way, the user may need only make fine adjustments to achieved the desired volume rather than larger volume adjustments that might otherwise be needed.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, the adaptation of the initial volume settings can be made driver dependent based on such things as the vehicle key or key fob borne by the driver. By detecting which driver is operating the vehicle, the audio system can access one or more specific initial volume settings associated with that driver and then use them at the beginning of the speech session. As another example, the volume settings and/or processing used to adjust those settings can be handled outside of the audio system 36 (e.g., in a telematics unit or elsewhere), with the information then being provided to the audio system as needed. All such other embodiments, changes, and modifications are intended to come within the scope of the appended claims.

As used in this specification and claims, the terms "for example," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A vehicle audio system, comprising:
an input for receiving audio speech signals;
a user-adjustable volume selector; and
a speaker, said audio system playing said audio speech signals via said speaker at a volume that is adjustable via the volume selector between a minimum volume setting and a maximum volume setting;
wherein, at the beginning of a speech session, said audio system plays said audio speech signals at an initial speech session volume that is within a range extending from an initial volume setting to one of the following: the minimum volume setting, the maximum volume setting, or a intermediate volume setting that is between the minimum and maximum volume settings, and wherein said audio system adjusts said initial volume setting following one or more speech sessions in which the volume is manually adjusted via the volume selector to a user-selected volume that is past the initial volume setting and out of the range.

2. A vehicle audio system as defined in claim 1, wherein the audio system comprises a vehicle speech system that includes a microphone connected to said input.

3. A vehicle audio system as defined in claim 1, wherein the audio system comprises a vehicle radio with said input being operatively connected to a vehicle speech system to receive the audio speech signals from the vehicle speech system.

4. A vehicle audio system as defined in claim 3, wherein said vehicle radio provides entertainment audio via said speaker at a volume that is adjustable via the volume selector, and wherein, during receipt of the audio speech signals, said audio system automatically inhibits playing of the entertainment audio via said speaker and plays said audio speech signals over said speaker at the initial speech session volume.

5. A vehicle audio system as defined in claim 4, wherein said audio system has a stored radio volume setting that is based on one or more previous radio volume settings, and wherein said initial speech session volume is selected based on one or more previous speech session volume settings and on a difference between the stored radio volume setting and the radio volume setting prior to inhibiting playing of the entertainment audio.

6. A vehicle audio system as defined in claim 1, wherein said initial volume setting is a minimum initial volume setting.

7. A vehicle audio system as defined in claim 6, wherein said audio system further includes a maximum initial volume setting with said range extending from said minimum initial volume setting to said maximum initial volume setting, and wherein both of said initial volume settings are automatically adjustable based on user manipulation of said volume selector during speech sessions.

8. A vehicle audio system as defined in claim 1, wherein said initial volume setting is a maximum initial volume setting that is adjustable in response to repeated adjustments of the volume above said maximum initial volume setting during previous speech sessions.

9. A vehicle audio system as defined in claim 1, further comprising a processor and memory within said audio system, wherein said memory stores said initial volume setting and said processor is programmed to automatically calculate adjustments to said initial volume setting and store the adjusted initial volume setting in said memory.

10. A vehicle audio system as defined in claim 1, further comprising a second speaker, wherein said audio system plays said audio speech signals over both of said speakers.

11. A vehicle audio system, comprising:
an input for receiving audio speech signals;
a user-adjustable volume selector; and
a speaker;
wherein said audio system provides entertainment audio via said speaker at a volume that is adjustable via the volume selector;
wherein, during receipt of the audio speech signals, said audio system automatically inhibits playing of the entertainment audio over said speaker and plays said audio speech signals over said speaker at an initial speech session volume that can be subsequently changed via said volume selector;
wherein said audio system selects said initial speech session volume such that it is not less than a minimum initial volume setting; and
wherein said minimum initial volume setting is automatically adjusted by said audio system based on one or more previous speech session volume settings.

12. A vehicle audio system as defined in claim 11, wherein said audio system has a stored radio volume setting that is based on one or more previous radio volume settings, and wherein said initial speech session volume is selected based on said one or more previous speech session volume settings and on a difference between the stored radio volume setting and the radio volume setting prior to inhibiting playing of the entertainment audio.

13. A vehicle audio system as defined in claim 11, wherein said audio system further includes a maximum initial volume setting, and wherein both of said initial volume settings are adjustable based on user manipulation of said volume selector during speech sessions.

14. A vehicle audio system as defined in claim 11, further comprising a processor and memory within said audio system, wherein said memory stores said minimum initial volume setting and said processor is programmed to automatically calculate adjustments to said minimum initial volume setting and store the adjusted minimum initial volume setting in said memory.

15. Vehicle electronics, comprising:
a vehicle speech system that includes a microphone for receiving user speech input and an output that provides audio speech signals; and
an audio system having an input operatively connected to said output to receive the audio speech signals, said audio system including a user-activated volume selector and one or more speakers such that said audio system provides entertainment audio via said speaker(s) at a volume that is adjustable via the volume selector;
wherein, during receipt of audio speech signals from said vehicle speech system, said audio system automatically inhibits playing of the entertainment audio via said speaker(s) and plays said audio speech signals over said speaker(s) at an initial speech session volume that can be subsequently changed via said volume control device;
wherein said audio system selects said initial speech session volume to be within a range of volumes bounded by a minimum initial volume setting and a maximum initial volume setting, and wherein said initial speech session volume is selected to be equal to the greater of the minimum initial volume setting and a previous speech session volume existing at termination of a previous speech session and to be equal to the lesser of the maximum initial volume setting and the previous speech session volume; and wherein at least one of the initial volume settings is automatically adjusted by said audio system based on a plurality of previous speech session volume settings that were used during a corresponding plurality of previous speech sessions.

* * * * *